(12) United States Patent
Reber et al.

(10) Patent No.: US 8,972,922 B2
(45) Date of Patent: Mar. 3, 2015

(54) METHOD FOR FORMING AN ELECTRICAL CONNECTION BETWEEN METAL LAYERS

(71) Applicants: Douglas M. Reber, Austin, TX (US);
Mehul D. Shroff, Austin, TX (US);
Edward O. Travis, Austin, TX (US)

(72) Inventors: Douglas M. Reber, Austin, TX (US);
Mehul D. Shroff, Austin, TX (US);
Edward O. Travis, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/096,051

(22) Filed: Dec. 4, 2013

(65) Prior Publication Data

US 2014/0094029 A1    Apr. 3, 2014

Related U.S. Application Data

(62) Division of application No. 13/562,538, filed on Jul. 31, 2012, now Pat. No. 8,640,072.

(51) Int. Cl.
| G06F 17/50 | (2006.01) |
| H01L 21/4763 | (2006.01) |
| H01L 29/40 | (2006.01) |
| H01L 21/768 | (2006.01) |

(52) U.S. Cl.
CPC ...... *H01L 21/76877* (2013.01); *H01L 21/4763* (2013.01); *G06F 17/5077* (2013.01); *H01L 29/401* (2013.01)
USPC ........... 716/126; 716/129; 716/130; 438/637; 257/774

(58) Field of Classification Search
USPC ............ 438/637; 716/126, 129–130; 257/774
See application file for complete search history.

(56) References Cited

U.S. PATENT DOCUMENTS

| 6,446,873 | B1 | 9/2002 | Geryk |
| 6,578,178 | B2* | 6/2003 | Mau ............................... 716/115 |
| 6,804,808 | B2 | 10/2004 | Li et al. |
| 6,816,995 | B2 | 11/2004 | Yokogawa |
| 7,033,924 | B2 | 4/2006 | Ogawa et al. |
| 7,080,329 | B1 | 7/2006 | Teig et al. |
| 7,160,805 | B1* | 1/2007 | Burke et al. ................... 438/687 |
| 7,464,352 | B2 | 12/2008 | Itoh |
| 7,716,620 | B2* | 5/2010 | Agarwal et al. ............... 716/126 |

(Continued)

OTHER PUBLICATIONS

Hall, Gavin, D.R. et al., "Impact of VIA Interactions and Metal Slotting on Stress Induced Voiding", IEEE CDR 46th Annual International Reliability Physics Symposium, Phoenix, 2008, pp. 392-398.

(Continued)

*Primary Examiner* — Stacy Whitmore

(57) ABSTRACT

A method includes forming a connection between a first metal layer and a second metal layer. The second metal layer is over the first metal layer. A via location for a first via between the first metal layer and the second metal layer is identified. Additional locations for first additional vias are determined. The first additional vias are determined to be necessary for stress migration issues. Additional locations necessary for second additional vias are determined. The second additional vias are determined to be necessary for electromigration issues. The first via and the one of the group consisting of (i) the first additional vias and second additional vias (ii) the first additional vias plus a number of vias sufficient for electromigration issues taking into account that the first additional vias, after taking into account the stress migration issues, still have an effective via number greater than zero.

6 Claims, 6 Drawing Sheets

(56) References Cited

U.S. PATENT DOCUMENTS

| | | | |
|---|---|---|---|
| 7,851,237 B2* | 12/2010 | Walter | 438/18 |
| 8,438,519 B2 | 5/2013 | Park | |
| 8,510,695 B1* | 8/2013 | Demircan et al. | 716/112 |
| 8,595,667 B1 | 11/2013 | Shroff et al. | |
| 8,640,072 B1 | 1/2014 | Reber et al. | |
| 2002/0100984 A1 | 8/2002 | Oshima et al. | |
| 2004/0063228 A1 | 4/2004 | Li et al. | |
| 2006/0156267 A1 | 7/2006 | Kato | |
| 2006/0160354 A1* | 7/2006 | Zhang et al. | 438/636 |
| 2006/0249846 A1 | 11/2006 | Yang et al. | |
| 2006/0267207 A1 | 11/2006 | Feustel et al. | |
| 2007/0234258 A1 | 10/2007 | Lee et al. | |
| 2007/0300195 A1 | 12/2007 | Li | |
| 2008/0182407 A1 | 7/2008 | Zhai et al. | |
| 2009/0228853 A1 | 9/2009 | Hong et al. | |
| 2009/0228856 A1 | 9/2009 | Park | |
| 2011/0283249 A1 | 11/2011 | Bickford et al. | |
| 2011/0304994 A1 | 12/2011 | Mair | |
| 2012/0088365 A1* | 4/2012 | Meyer et al. | 438/659 |
| 2013/0026647 A1 | 1/2013 | Ireland | |
| 2013/0185684 A1 | 7/2013 | Barwin et al. | |
| 2013/0326448 A1* | 12/2013 | Demircan et al. | 716/112 |
| 2014/0038317 A1* | 2/2014 | Travis et al. | 438/10 |

OTHER PUBLICATIONS

Ogawa, E.T., et al, "Stress-Induced Voiding Under Vias Connected to Wide Cu Metal Leads", IEEE 40th Annual International Reliability Physics Symposium, Dallas, Texas, 2002, pp. 312-321.

Takashima, Y., et al., "Practical Redundant-Via Insertion Method Considering Manufacturing Variability and Reliability", IEICE Transactions on Fundamentals of Electronics, Communications and Computer Sciences, vol. E92-A No. 12, Dec. 1, 2009, Summary of pp. 2962-2970.

Lienig, J., "Invited Talk: Introduction to Electromigration-Aware Physical Design", Dresden University of Technology, Institute of Electromechanical and Electronic Design (IFTE), ISPD, '06, Apr. 9-12, 2006, San Jose, CA, USA, pp. 39-46.

Office Action mailed Apr. 30, 2013 in U.S. Appl. No. 13/661,131.

Srinivisan, J., et al., "The Impact of Technology Scaling on Lifetime Reliability", IEEE, Proceedings of the 2004 International Conference on Dependable Systems and Networks (DSN '04), Sep. 2004.

Lu, Z., et al., "Interconnect Lifetime Prediction under Dynamic Stress for Reliability-Aware Design", IEEE, Mar. 2004, pp. 327-334.

Ye, H., "Numerical Simulation of Stress Evolution During Electromigration in IC Interconnect Lines", IEEE Transactions on Components and Packaging Technologies, vol. 26, No. 3, Sep. 2003, pp. 673-681.

U.S. Appl. No. 13/313,179, Shroff, M., et al., "Method of Protecting Against Via Failure and Structure Therefor", filed Dec. 7, 2011.

U.S. Appl. No. 13/285,073, Reber, D.M., et al., "Semiconductor Device With Vias on a Bridge Connecting Two Buses", filed Oct. 31, 2011.

Zhai, C.J., et al., "Stress Modeling of Cu/Low-k BEoL-Application to Stress Migration", IEEE 42nd Annual International Reliability Physics Symposium, Phoenix, 2004, pp. 234-239.

Srinivisan, J., et al., "IBM Research Report, RAMP: A Model for Reliability Aware MicroProcessor Design", Computer Science, RC23048 (W0312-122), Dec. 29, 2003, pp. 1-25.

Bose, P., Power- and Reliability-Aware (Integrated) Design: Challenges and Opportunities, IBM Corporation, T.J. Watson Research Center, USC Talk, Oct. 20, 2005, pp. 1-63.

Borgeson, P., et al., "Stress evolution during stress migration and electromigration in passivated interconnect lines", AIP Conference Proceedings 305, Stress induced phenomena in metallization: Second international workshop, Mar. 29-31, 1993, Austin, TX.

Notice of Allowance mailed on Sep. 18, 2013, U.S. Appl. No. 13/661,131.

Office Action mailed Jan. 27, 2014 in U.S. Appl. No. 13/562,534.

U.S. Appl. No. 13/562,534, Travis, Edward, "Method for Forming an Electrical Connection Between Metal Layers", filed Jul. 31, 2012, Office Action—Notice of Allowance, mailed Aug. 15, 2014.

U.S. Appl. No. 13/562,534, Travis, Edward, "Method for Forming an Electrical Connection Between Metal Layers", filed Jul. 31, 2012, Office Action—Rejection, mailed Mar. 28, 2014.

* cited by examiner

METHOD FOR FORMING AN ELECTRICAL CONNECTION BETWEEN METAL LAYERS

CROSS-REFERENCE TO RELATED APPLICATION(S)

This application is related to U.S. patent application Ser. No. 13/562,534, filed on even date, entitled "METHOD FOR FORMING AN ELECTRICAL CONNECTION BETWEEN METAL LAYERS," naming Edward O. Travis, Douglas M. Reber, and Mehul D. Shroff as inventors, and assigned to the current assignee hereof.

BACKGROUND

1. Field

This disclosure relates generally to semiconductor processing, and more specifically, to a method for forming an electrical connection between metal layers.

2. Related Art

Conductive vias provide electrical connections between metal layers of an integrated circuit. However, stress migration over time may result in via failures within the integrated circuit. For example, during operation of the integrated circuit, stress migration can cause the accumulation of vacancies within or at a conductive via, thus increasing the resistance of the conductive via over time. Eventually, the increasing resistance due to the vacancies may cause via failure. Stress migration may therefore affect long term operation and reliability of the integrated circuit.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As discussed above, stress migration can cause a via failure over time. Therefore, one embodiment of the present disclosure uses a geometry-based stress migration model of a circuit design to identify those vias in the circuit design which are at high risk for failing due to stress migration. In response to identification of a high risk via, one or more additional vias may be added to the circuit design to reduce the risk level of the via to an acceptable level for stress migration. Furthermore, electromigration can also cause via failure over time. Therefore, in one embodiment, one or more additional vias may be added to the circuit design to reduce the risk level of the via to an acceptable level for electromigration.

Figure 3:
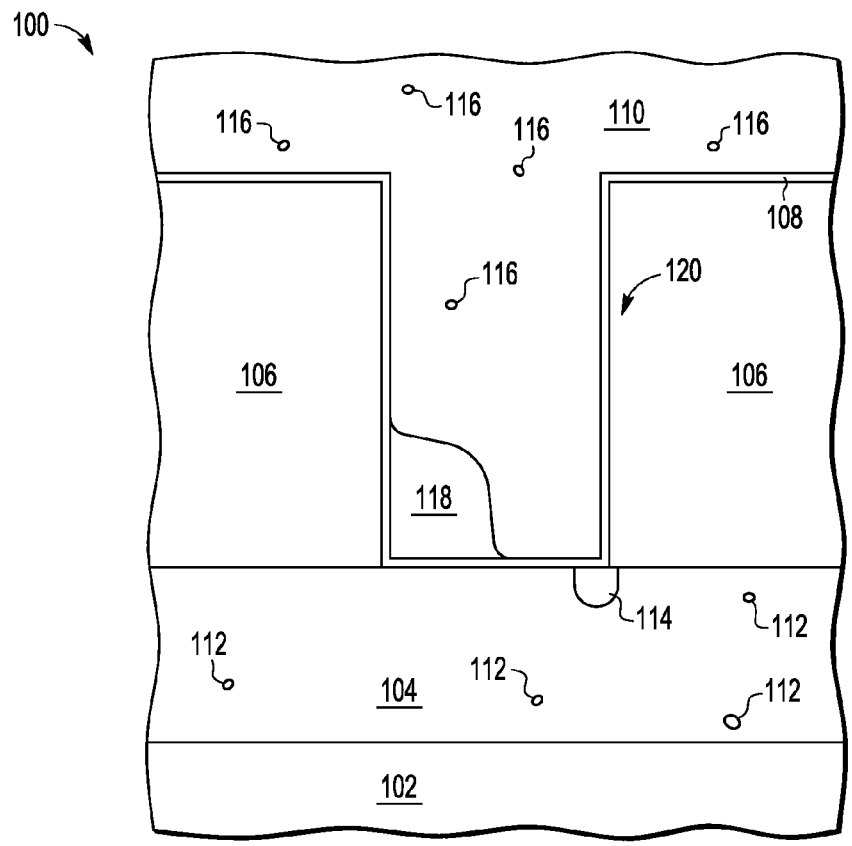
FIG. 3 illustrates a cross section of an exemplary via.

For example, FIG. 3 illustrates a cross section of a circuit 100 which includes a via 120 formed in a first metal layer 110 and which electrically contacts an underlying metal layer 104. As illustrated in FIG. 3, metal layer 104 may overlie a number of integrated circuit layers 102. Integrated circuit layers 102 may include one of more of a substrate, active circuitry, dielectric layers, other metal layers, etc. Circuit 100 includes a dielectric layer 106 over metal layer 104 which includes an opening in which via 120 is formed. Metal layer 110 is formed over dielectric layer 106 and extends into the opening of dielectric 106 to form via 120. A barrier layer 108 is located between the metal of metal layer 110 and via 120 and dielectric layer 106. Metal layer 110 includes vacancies 116 and metal layer 104 includes vacancies 112. Vacancies refer to vacant lattice sites or grain boundary discontinuities in the metal layer which may form as a result of the processing steps used to form circuit 100. That is, vacancies are locations of low density in the metal crystal structure due to missing metal atoms or discontinuities in the crystal structure, such as at grain boundaries. These vacancies migrate, over time, due to stress gradients (in a process called stressmigration), to the boundary between via 120 and metal layer 104. As they accumulate at the boundary, they may form highly resistive regions or voids such as voids 118 and 114. Void 118 is formed as a result of vacancies 116 from metal layer 110 which have migrated to the boundary of via 120 and barrier layer 108. Void 114 is formed as a result of vacancies 112 from metal layer 104 which have migrated to the boundary of via 120 and metal layer 104. Note that barrier layer 108 prevents the vacancies from one metal layer on one side of barrier layer 108 to cross into the other metal layer on the other side of barrier layer 108. Therefore, if either of voids 118 and 114 become too large, the overall resistance of via 120 becomes too large, resulting in failure of via 120. In some embodiments, a resistance increase of 10 to 20 percent may be considered a failure. Note that, in some situations, each of voids 118 and 114, alone, would not have resulted in failure of via 120, but their combined effect may result in failure of via 120. Note that the amount of vacancies from a metal layer which accumulate at the boundary between via 120 and metal layer 104 depends on the volume of the metal layer providing the vacancies and the distance from the via.

Figure 1:
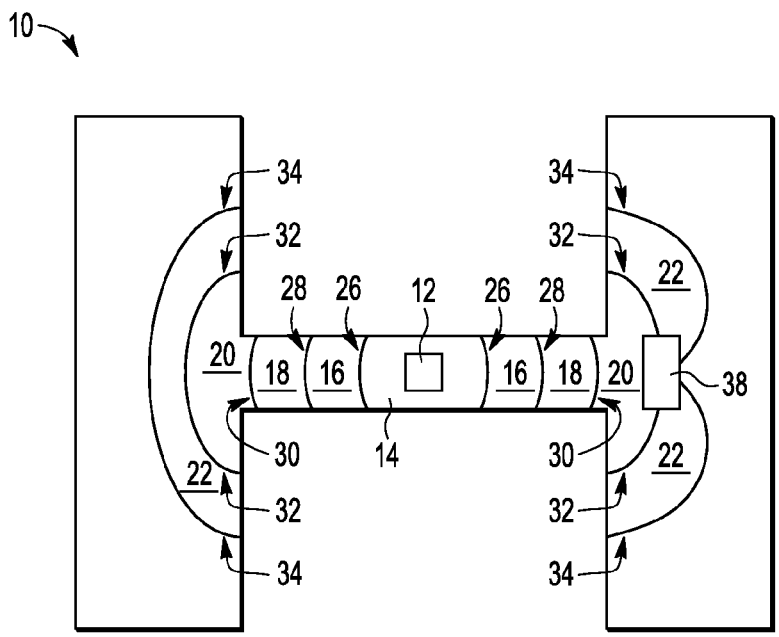
FIG. 1 illustrates a top down view of a metal layer to which a via is connected along with vacancy regions corresponding to the via, in accordance with an embodiment of the present disclosure.

FIG. 1 illustrates a top down view of a metal layer 10 which includes a via 12 and a key hole opening 38 (note that via 12 is filled with a conductive material while key hole opening 38 is a hole in metal layer 10 that is filled with a non-conductive material). Metal layer 10 may correspond to top metal layer 110 of FIG. 3 and via 12 may correspond to via 120 of FIG. 3. FIG. 1 also illustrates a plurality of vacancy regions 14, 16, 18, 20, and 22 which surround via 12 at increasing distances from via 12. Each vacancy region has a corresponding outer boundary 26, 28, 30, 32, and 34, respectively. Each vacancy region corresponds to a region which is at a particular distance from via 12 and is capable of providing vacancies which may reach via 12. Each vacancy region has an associated volume which corresponds to the surface area of the region multiplied by the thickness of layer 10. For example, the area of vacancy region 14 corresponds to the surface area of metal layer 10 between the perimeter of via 12 and boundary 26. The area of vacancy region 16 corresponds to the surface area of metal layer 10 between boundaries 26 and 28. The area of vacancy region 18 corresponds to the surface area of metal layer 10 between boundaries 28 and 30. The area of vacancy region 20 corresponds to the surface area of metal layer 10 between boundaries 30 and 32. The area of vacancy region 22 corresponds to the surface area of metal layer 10 between boundaries 32 and 34. In general, each vacancy region surrounds via 12 at increasing distances with a circular pattern. However, note that key hole opening 38 may disrupt the circular pattern of the vacancy regions since the vacancies which would travel to via 12 may be interrupted by opening 38, forcing the vacancies to take a longer path to via 12 around opening 38. The distance of each vacancy region from via 12 affects the probability that a vacancy will actually reach via 12 from the vacancy region. Therefore, as the distance from via 12 increases, the probability that a vacancy will reach via 12 decreases. Furthermore, beyond a particular distance from via 12 (such as beyond boundary 34), there may be no meaningful amount of vacancies expected to reach via 12. Note that this probability that a vacancy will reach via 12 may be referred to as a threat level, where the threat level decreases as the distance increases.

Figure 2:
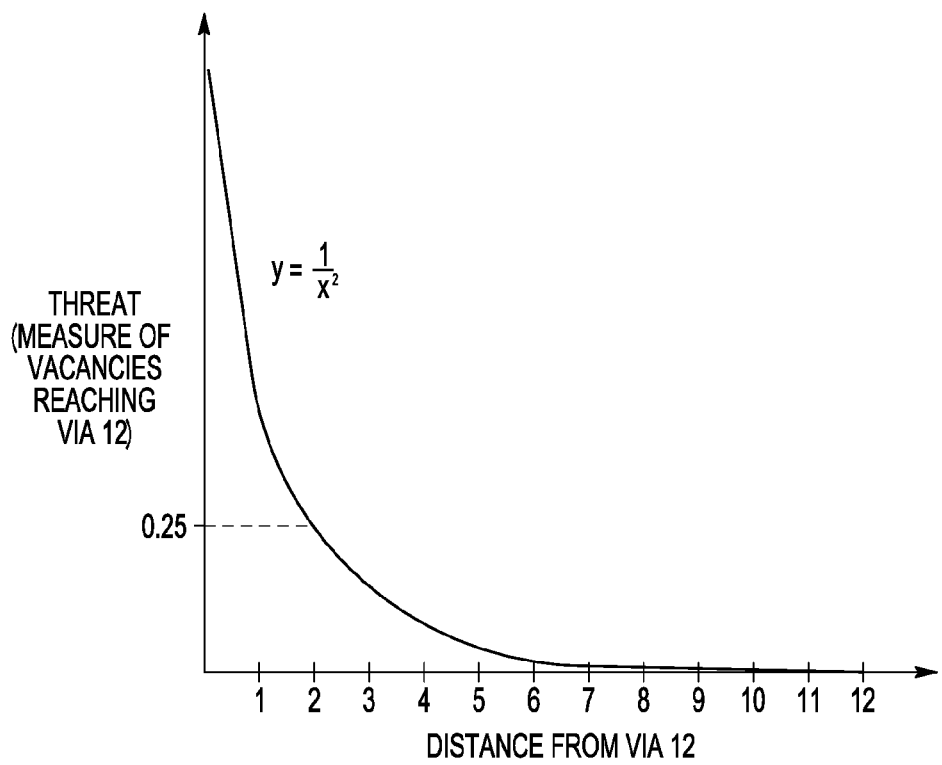
FIG. 2 illustrates an exemplary graph which shows how a measure of vacancies expected to reach the via of FIG. 1 is based upon a distance from the via.

FIG. 2 illustrates an exemplary graph which illustrates how the threat level is a function of distance, in which the threat level decreases as distance increases. That is, at a closest distance from via 12 (e.g. distance 1 in FIG. 2), the threat level is 1. This indicates that there is a 100% probability that a vacancy at this distance will reach via 12. At the next closest distance from via 12 (e.g. distance 2 in FIG. 2), the threat level is reduced to 0.25, indicating a 25% probability only that a vacancy at this distance will reach via 12. Note that the threat level correlates to a measure of vacancies reaching via 12 from a certain distance from via 12. In the illustrated example, the threat level is a function of $1/(\text{distance from via})^2$. In alternate embodiments, different functions may be used to represent the threat level (or measure of vacancies reaching a via) as a function of distance. For example, testing may be performed on various circuits to obtain data points from which to derive the appropriate function. Such testing could be done through a set of test structures, such as, for example, via Kelvin (four-terminal) resistance structures or via chains, with different volumes of metal located at different distances from the via(s), by stressing these structures through temperature cycling and subsequently measuring the resistance change of the structures as a function of stress time.

Therefore, referring back to FIG. 1 in combination with FIG. 2, the outer boundary of each region may be used as the effective distance from the via from which to determine the threat level. For example, boundary 26 may correspond to the threat level at a distance of "1" in FIG. 2, boundary 28 may correspond to the threat level at a distance of "2" in FIG. 2, boundary 30 may correspond to the threat level at a distance of "3" in FIG. 2, etc. Alternatively, a particular point between the inner and outer boundaries of each region, such as a distance half way between the inner and outer boundaries of each region, may be used as the effective distance for each region. For the case of region 14, a point between the perimeter of via 12 and boundary 26 may be used. Also, note that the total threat of vacancies from a vacancy region is also based upon the volume of the region. Therefore, a total measure of vacancies reaching via 12 from a particular vacancy region from a particular metal layer corresponds to the threat level at the effective distance of the vacancy region multiplied by a thickness of the metal layer and multiplied by the area of the vacancy region.

FIG. 1 may correspond to a model of an integrated circuit used to identify at-risk vias for failure due to stress migration, and, in response to identification of an at-risk via, one or more additional vias may be added. FIG. 1 illustrates a first metal layer to which via 12 makes an electrical connection (e.g., metal layer 10 may correspond to top metal layer 110 in FIG. 3). However, a similar analysis is performed for a second metal layer to which via 12 makes an electrical connection (e.g. bottom metal layer 104). That is, a total measure of vacancies reaching via 12 includes the vacancies reaching via 12 from each metal layer to which via 12 makes electrical connection.

Figure 7:
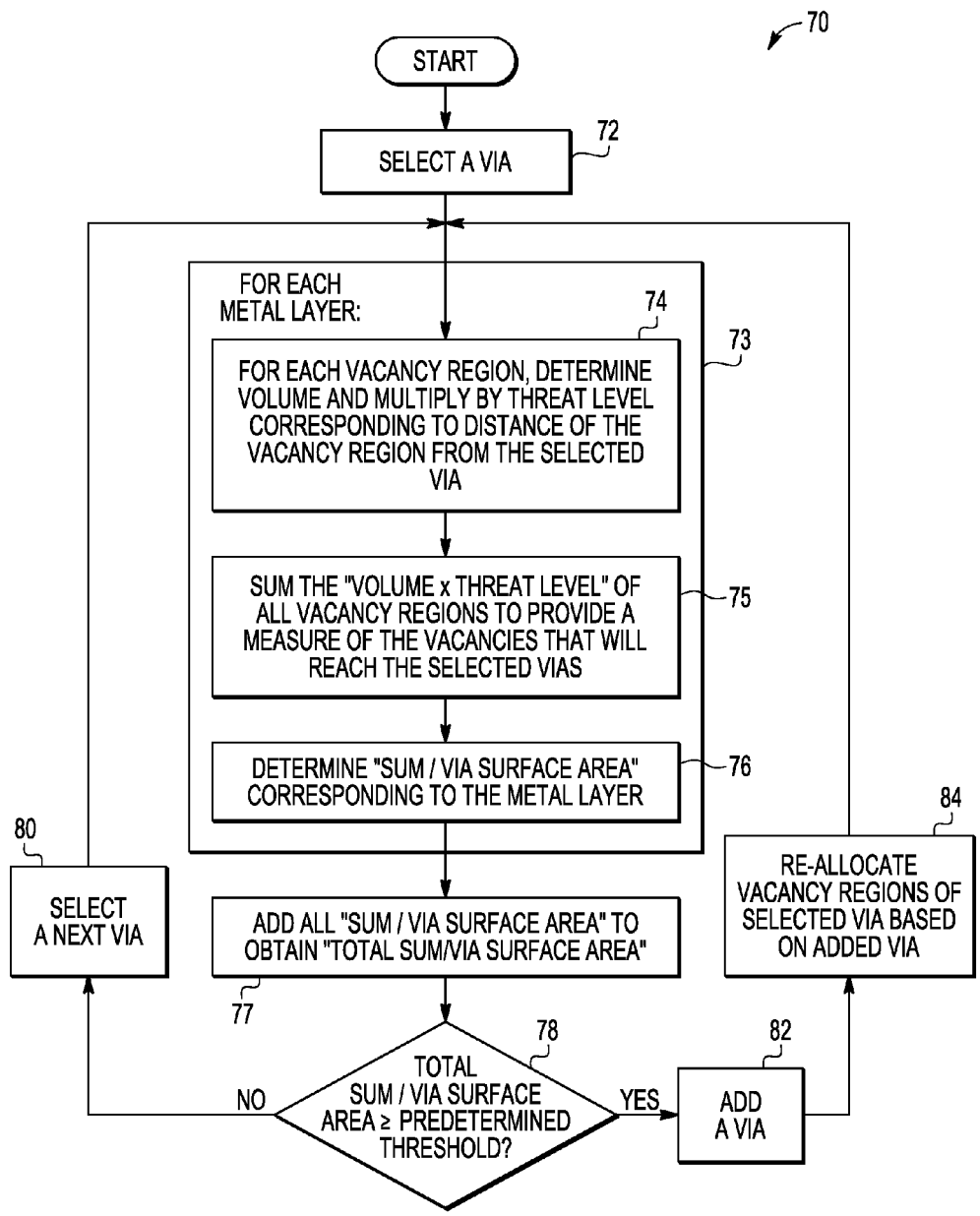
FIG. 7 illustrates a method for selectively adding one or more vias to address stress migration in accordance with an embodiment of the present disclosure.

FIG. 7 illustrates a method 70 of selectively adding one or more vias to address stress migration, in accordance with one embodiment. Method 70 begins with block 72 in which a via is selected. For ease of explanation, method 70 will be described in reference to the circuit model of FIG. 1, in which via 12 corresponds to the selected via which will be analyzed for the effects of status migration. Method 70 proceeds from block 72 to block 73. Within block 73, blocks 74, 75, and 76 are performed for each metal layer to which the selected via makes electrical connection. For example, for via 12, blocks 74, 75, and 76 are performed for each of metal layer 110 and metal layer 104, since both of the layers may provide vacancies to via 12. Therefore, for a first metal layer 10 (which, in this embodiment, may refer to metal layer 110), method 70 continues with block 74, in which, for each vacancy region, the volume is determined and multiplied by the threat level corresponding to the distance of the vacancy region from the selected via. Referring to the example of FIG. 1, the volume of each vacancy region is determined by multiplying the surface area of metal layer 10 of the vacancy region by the thickness of metal layer 10 to obtain a product result for each vacancy region. Each volume is then multiplied by the threat level corresponding to the effective distance of the vacancy region from via 12 to obtain the product for each vacancy region. The threat level may be obtained by using the function of FIG. 2, as described above. Note that since the threat level decreases as effective distance increases, the threat level may be referred to as an attenuator which is based on the effective distance.

Still referring to the current metal layer 10, method 70 proceeds from block 74 to block 75 in which the product result ("volume×threat level") of each vacancy region is summed to provide a measure of the total number of vacancies which will reach the selected via from the current metal layer. In reference to FIG. 1, the "sum" obtained in block 75 corresponds to the measure of vacancies expected to reach via 12 from metal layer 10 (taking into consideration all of regions 14, 16, 18, 20, and 22 of metal layer 10). Method 70 then proceeds to block 76 in which this "sum" is then divided by the surface area of the selected via to obtain the "sum/via surface area" corresponding to the current metal layer. For example, a via with a larger surface area may be able to handle a greater amount of vacancy accumulation as compared to a via with a smaller surface area. Therefore, the "sum" is dived by the surface area in order to provide a measure of vacancies expected to reach via 12 from metal layer 10 per unit surface area of via 12. (If metal layer 10 corresponds to metal layer 110, then this measure of vacancies can be referred to as a lower measure since it corresponds to the lower metal layer connected to via 12.)

Blocks 74-76 are then repeated for the second metal layer. For example, if metal layer 10 corresponds to metal layer 110, then the same analysis is performed for metal layer 104. That is, the model of metal layer 104 also includes vacancy regions, similar to those described in reference to metal layer 10 of FIG. 1. Therefore, for each vacancy region of metal layer 104, the volume is determined and multiplied by the threat level in block 74, the product result ("volume×threat level") of each vacancy region is then summed to provide a measure of the vacancies which will reach the selected via from metal layer 104 in block 75, and the "sum" is then divided by the surface are of the selected via to obtain the "sum/via surface area" corresponding to the current metal layer (now metal layer 104). (If the current metal layer corresponds to metal layer 104, then this measure of vacancies can be referred to as an upper measure since it corresponds to the upper metal layer connected to via 12.)

After blocks 74-76 are performed for each metal layer to which the selected via is connected, method 70 proceeds to block 77 in which the sum per via surface area ("sum/via surface area") corresponding to each metal layer is added together to obtain the total sum per via surface area ("total sum/via surface area"). Therefore, the total sum per via surface area determined in block 77 corresponds to a measure of vacancies from both layers connected to the selected via that are expected to reach the selected via. In the illustrated embodiment, a sum is performed of each sum/via surface area determined in block 73. However, in alternate embodiments, a weighted sum of each sum/via surface area may be performed in which the sum/via surface area of one metal layer may be more heavily weighted as compared to the sum/via surface area of the other metal layer.

Method 70 proceeds to decision diamond 78 in which the "total sum/via surface area" is compared to a predetermined threshold. This predetermined threshold (also referred to as a predetermined number) represents the maximum measure of vacancies per unit area that is allowable for appropriate operation. (Therefore, note that the predetermined threshold takes into account a surface area or radius of the selected via.) For example, in one embodiment, the value of the predetermined threshold is chosen to represent an increase of via resistance of 10%. Also, in this embodiment, it is assumed that the value of the predetermined threshold is 20. However, alternatively, other values for the predetermined threshold may be used such as in situations when a different variation of resistance is considered acceptable. Therefore, in one embodiment, the predetermined threshold represents the maximum acceptable variation in resistance of a via so that it may still be considered sufficiently operational. In the current embodiment, it is assumed that if the resistance of a via is expected to change by 10% or more, the via is no longer considered acceptable. Also, note that if a particular via is expected to have a 10% change in resistance, it may be considered to be only 90% of a "fully operational via" (or 0.9 vias). Similarly, a particular via that is expected to have a 25% change in resistance may be considered to only be 75% of a fully operational via or 0.75 vias. These fractional values of the via based on the expected change in resistance may be referred to as the effective via number of a via. In one embodiment, the effective number of a via is based on the "total sum/via surface area" and varies linearly with this value. In the current embodiment, a total sum/via surface area of 20 indicates 0.9 vias, while a total sum/via surface area of 10 indicates 0.95 vias (or 95% of a fully operational via), a total sum/via surface area of 30 indicates 0.85 vias (or 85% of a fully operational via), etc. Therefore, in one embodiment, the effective number of a via is based on the measure of vacancies expected to reach the via (which, in turn, affects the resistance of the via).

Referring back to FIG. 7, if, at decision diamond 78, the "total sum/via surface area", does not exceed the predetermined threshold, then the selected via is not deemed to be at-risk for failure due to stress migration (because its change in resistance over time is not expected to reach or exceed 10%). That is, the total sum/via surface area indicates that there is no threat to the integrity of the selected via from vacancies. Method 70 proceeds to block 72 in which another via in the circuit design is selected. Method 70 then returns to block 74.

Figure 4:
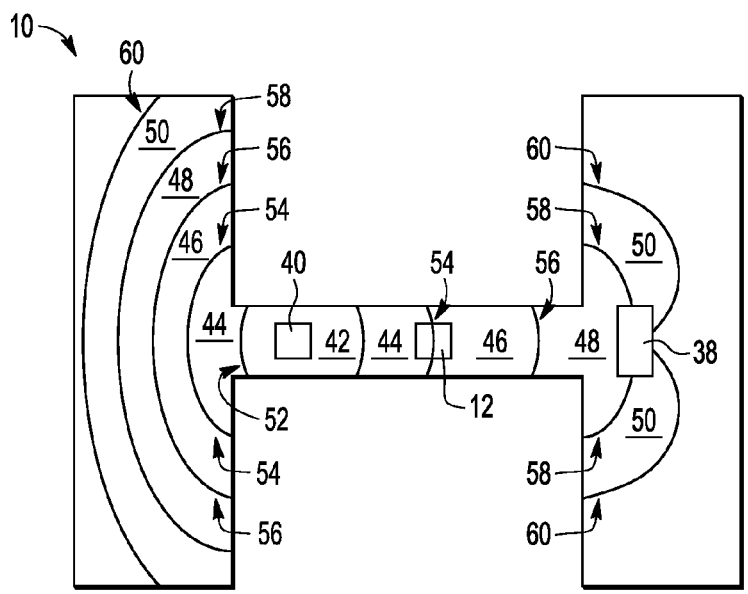
FIG. 4 illustrates a top down view of the metal layer of FIG. 1 after including an additional via, in accordance with an embodiment of the present disclosure.

At decision diamond 78, if the "sum/via surface area" does reach or exceed the predetermined threshold, then the increase in resistance of the selected via is expected to reach or exceed 10%. In this case, method 70 proceeds to block 82 in which a via is added. For example, FIG. 4 illustrates a top down view of the circuit design of FIG. 1 after addition of via 40. Via 40 is added into the design at a location which will attract sufficient vacancies which would have otherwise reached via 12 in order to reduce the number of vacancies expected to reach via 12. In the illustrated embodiment, via 40 is placed to the left of via 12. Via 40 is surrounded by vacancy regions 42, 44, 46, 48, and 50 located at increasing distances from via 40. (Note that these vacancy regions do not take into consideration via 12 or the vacancy regions of via 12.) Each of vacancy regions 42, 44, 46, 48, and 50 has a corresponding outer boundary 52, 54, 56, 58, and 60, respectively. Each vacancy region of FIG. 4 corresponds to a region which is at a particular distance from via 40 and is capable of providing vacancies which may reach via 40. Each vacancy region has an associated volume which corresponds to the surface area of the region multiplied by the thickness of layer 10 (as was described above in reference to the vacancy regions of FIG. 1). In general, each vacancy region surrounds via 40 at increasing distances with a circular pattern. However, note that key hole opening 38 may disrupt the circular pattern of the vacancy regions since the vacancies which would travel to via 40 may be interrupted by opening 38. The distance of each vacancy region from via 40 affects the probability that a vacancy will actually reach via 40 from the vacancy region. Therefore, as the distance from via 40 increases, the probability that a vacancy will reach via 40 decreases. Furthermore, beyond a particular distance from via 40 (such as beyond boundary 60), there may be no meaningful amount of vacancies expected to reach via 40.

Figure 5:
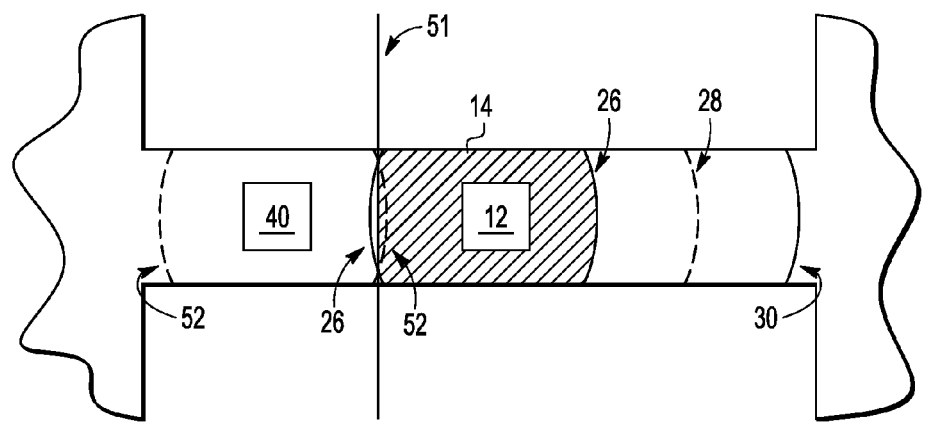
FIG. 5 illustrates a top down view of a portion of the metal layer of FIG. 4 in accordance with an embodiment of the present disclosure.

Referring back to FIG. 7, method 70 proceeds to block 84 in which the vacancy regions of the selected via are re-allocated based on the added via. For example, referring to FIG. 1, vacancy regions 14, 16, 18, 20, and 22 change due to the addition of via 40 and the vacancy regions corresponding to via 40 (regions 42, 44, 46, 48, and 50). FIG. 5 illustrates a top down view of a portion of the circuit design of FIG. 4 in which the vacancy regions of via 12 have been re-allocated taking into consideration added via 40, in accordance with one embodiment. In the embodiment of FIG. 5, it is assumed that at a point between vias 40 and 12 (such as, for example, midpoint 51), there is a line of symmetry such that there are as many vacancies diffusing in one direction across the line toward via 12 as there are diffusing in the other direction across the line toward via 40, and so it may be said that the vacancies from one side are essentially not expected to reach the via of the other side. For example, it may be assumed that, from the perspective of via 12, vacancies beyond midpoint 51 will be attracted to via 40 rather than to via 12. Therefore, the vacancy regions of via 12 will no longer surround via 12 into regions of metal layer 10 which are beyond midpoint 51, on the side in which via 40 is located. For example, region 14 would now stop at midpoint 51 and no longer fully extend to out boundary 26 on the left of midpoint 51. In an alternate embodiment, the decay function shown in FIG. 2 would have a discontinuity at the distance represented by the location of via 40, resulting in a different (e.g. lower) threat level on one side of via 12.

Method 70 then returns to block 73 in which the analysis of determining the "total sum/via surface area" of via 12 is again performed, but using the redefined vacancy regions. Note that the area, and thus volume, of each vacancy region will now be less since the areas located to the left of midpoint 51 are no longer considered in determining the measure of vacancies. At decision diamond 78 it is determined again if the predetermined threat level is reached or exceeded. Note that, due to the addition of a via, such as via 40, the effective number of the selected via (via 12) may also change from the previous iteration. It may have been only 0.75 vias in the previous iteration and now may be 0.85 or 0.95 vias. That is, due to the addition of a via, the effective number of the selected via should increase. Therefore, referring to decision diamond 78, if the predetermined threat level is reached or exceeded, then via 40 was not sufficient, and another via may be added to further attract vacancies which would have otherwise been expected to reach via 12. This process is repeated until sufficient vias have been added.

In some embodiments, the vias at a given level in a given technology node may all be of the same nominal size, in which case, the summation of the "volume×threat level" products over all the vacancy regions of interest may be sufficient to compute the measure of vacancies expected to reach via 12. Therefore, the subsequent computation of the "sum/via surface area" (of block 76) may not be needed, and the total sum (of block 77) would not be "per surface area". In this case, the predetermined threshold may not be in units of vacancies per unit area but may be in units of total vacancies per via if all vias are the same size. Also, in some embodiments, the metal thickness within a given layer is fixed, and the predetermined value may represent vacancies per thousand angstroms. In this case, the thickness of the metal or the via area might be factored into the predetermined value instead of being accounted for in the summation step.

Figure 6:
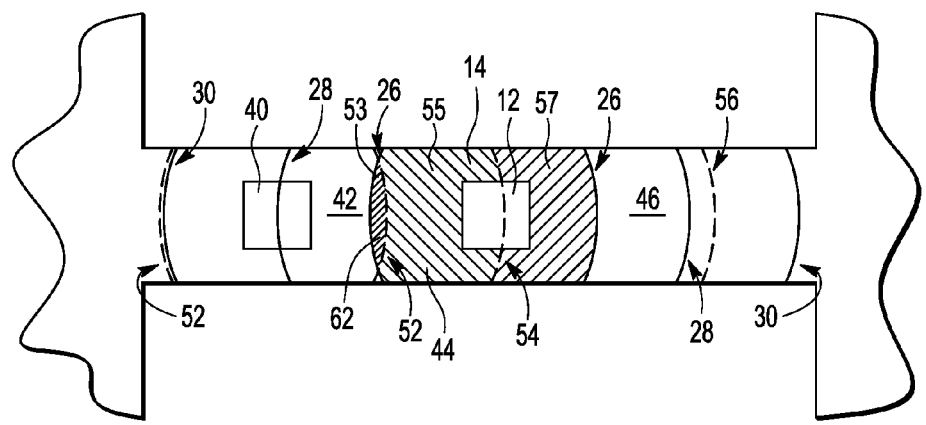
FIG. 6 illustrates a top down view of a portion of the metal layer of FIG. 4 in accordance with an embodiment of the present disclosure.

FIG. 6 illustrates a top down view of a portion of the circuit design of FIG. 4 in which the vacancy regions of via 12 have been re-allocated taking into consideration added via 40, in accordance with another embodiment. In the embodiment of FIG. 6, it is assumed that there is a subtractive effect within those vacancy regions of via 12 that are overlapped by those vacancy regions of via 40. For example, in referring to vacancy region 14 of via 12, the threat level of vacancy region 14 on via 12 is diminished, in part, by: the threat level of vacancy region 42 of via 40 (which overlaps a portion 53 of vacancy region 14, in which portion 53 is indicated by the narrower forward hashing), the threat level of vacancy region 44 of via 40 (which overlaps a portion 55 of vacancy region 14, in which portion 55 is indicated by the backwards hashing), and the threat level of vacancy region 46 of via 40 (which overlaps a portion 57 of vacancy region 14, in which portion 57 is indicated by the wider forward hashing). That is, the effective threat level of region 14 is diminished by the vacancy regions of via 40 because vacancies in these regions have the opportunity to be attracted to via 40 in place of via 12. Alternatively, in each overlap portion of two vacancy regions of two different vias (such as vias 12 and 40), the one with the higher threat level may be used and all vacancies from that overlap portion are expected go to the via to which the vacancy region with the higher threat level corresponds. Therefore, note that many different methods may be used to re-allocate vacancy regions of the selected via based on the one or more added vias. After each added via, a re-allocation is performed, and the method 70 returns to block 74, as described above, to determine if sufficient vias were added to sufficiently reduce the risk of the selected via.

Note that, with respect to each added via in block 82, the via may make an electrical connection between metal layer 10 and a bottom metal layer, as via 120 in FIG. 3, or may alternatively be a decoy via formed in metal layer 10 which does not make an electrically functional connection to another metal layer. Also, in alternate embodiments, more than one via may be added at each iteration in block 82. Furthermore, the number of vias added in block 82 may be dependent on the extent to which the total sum/via surface area exceeds the predetermined threshold.

In an alternate embodiment of FIG. 7, rather than performing blocks 74-76 for each metal layer to which the selected via is connected to obtain a total sum/via surface area, blocks 74-76 may only be performed for one metal layer. In this case, the total sum/via surface area would just be a measure of those vacancies expected to reach via 12 from one of the metal layers to which via 12 is connected. Vias are iteratively added, as needed, based on whether this total sum/via surface area reaches or exceeds the predetermined threshold until the total sum/via surface area is less than the predetermined threshold. At this point, blocks 74-76 are then performed for the other metal layer. In this case, the total sum/via surface area would just be a measure of those vacancies expected to reach via 12 from the other one of the metal layers to which via 12 is connected. Vias can then be iteratively added, as needed, based on this total sum/via surface area.

In yet another embodiment, blocks 74-76 may be performed for each metal layer, but rather than adding the sum/via surface area to obtain the total sum/via surface area, a maximum of the sum/via surface areas measures may be used as the total sum/via surface area. For example, the sum/via surface area from metal layer 110 may exceed the predetermined threshold while the sum/via surface area from metal layer 104 may be less than the predetermined threshold.

In another embodiment, each sum/via surface area from each metal layer may be compared to a corresponding predetermined threshold. For example, the sum/via surface area from metal layer 110 may be compared to a first predetermined threshold and the sum/via surface area from metal layer 104 may be compared to a second predetermined threshold. In this example, a via may be iteratively added until the sum/via surface area from metal layer 110 is less than the first predetermined threshold and the sum/via surface area from metal layer 104 is also less than the second predetermined threshold.

Method 70 may be performed on each via in the model of the integrated circuit. Furthermore, method 70 may also be performed on each of the vias which were added in block 82 as a result of the analysis on selected via 12. Therefore, in block 82 in which a next via is selected, this next selected via may be one of the vias which were added during a previous iteration of method 70. In this manner, each added via is also checked (and fixed, if necessary, through the addition of more vias) for stress migration issues.

As described above, stress migration may result in the accumulation of voids at the interface between a via and the underlying metal layer to which an electrical connection is made. Therefore, one or more additional vias may be added to the integrated circuit to address the stress migration issues for selected via 12. Alternatively, no additional vias may be needed for via 12 since the sum/via surface area for via 12 may exceed the predetermined threshold. Any additional vias which were added to address the stress migration issues for 12 can be represented as an effective via number. That is, as described above, each via may have a corresponding effective via number. For example, for via 12, the analysis performed in block 73 to obtain total sum/via surface area can be used to obtain an effective number (e.g. 0.95 vias, 0.85 vias, 0.8 vias). That is, the effective number of a via corresponds to either a fully effective via or some fraction or percentage of a fully effective via. This analysis of block 73 can be performed on any via to determine the effective number of each added via. The effective via number of multiple vias can then be added to find a total effective via number for the multiple vias. For example, although 2 vias may be added corresponding to via 12 (such as by adding a via in block 82 twice), the effective via number may be less than 2. In this case, each added via may only have the effectiveness of a fraction of a via, based, for example, on the expected resistance change of the via.

Figure 8:
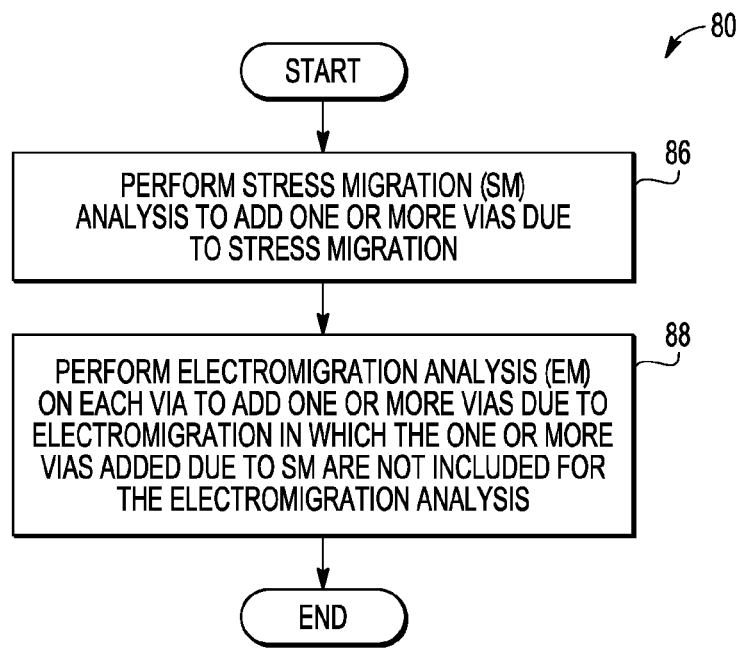
FIG. 8 illustrates a method for selectively adding one or more vias to address stress migration and/or electromigration, in accordance with an embodiment of the present disclosure.
Figure 9:
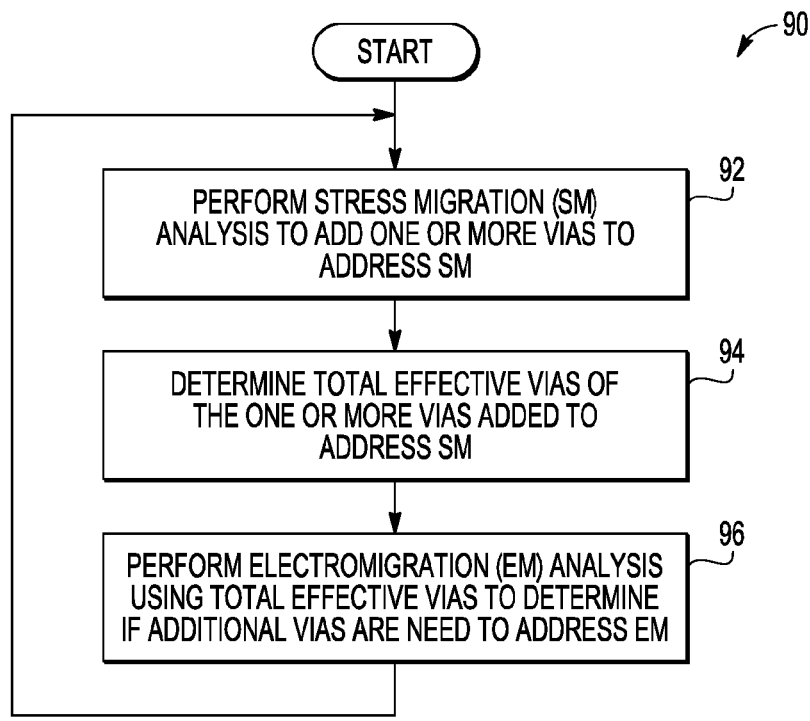
FIG. 9 illustrates a method for selectively adding one or more vias to address stress migration and/or electromigration, in accordance with an embodiment of the present disclosure.

Also, in addition to the effects of stress migration due to inherent stresses in the metal-via structure and the properties of the various films, electromigration may also cause a via to fail by causing a movement of metal atoms due to impact with electrons, resulting in a void being formed at the locations where the electron flow originates. In order to prevent via failure due to electromigration, additional vias may be added to handle the current between the two metal layers connected by the selected via. Therefore, in order to prevent via failure of a selected via, such as via 12, one or more vias may be needed in order to address the effects of stress migration and one or more vias may be needed in order to address the effects of electromigration. FIGS. 8 and 9 illustrate methods for selectively adding one or more vias to address stress migration and/or electromigration.

FIG. 8 illustrates a method 80 for selectively adding one or more vias to address stress migration and/or electromigration. Method 80 begins with block 86 in which stress migration (SM) analysis may be performed for each via of an integrated circuit model to result in the addition of one or more vias due to stress migration. That is, as a result of the SM analysis one or more vias may be added to the integrated circuit model to address the effects of stress migration. In one embodiment, method 70 of FIG. 7 may be used as the SM analysis. Alternatively, other methods for SM analysis may be used to determine the addition of one or more vias. After SM analysis, method 80 proceeds to block 88 in which electromigration (EM) analysis is performed on each via in order to add one or more vias due to EM in which the one or more vias added due to SM are not included for the EM analysis. That is, for each via present in the integrated circuit model prior to the SM analysis, an EM analysis is performed to determine how many vias, if any, to add to address the effects of EM. In this embodiment, one or more additional vias are added to address each of SM and EM independently.

Note that, in one embodiment, the one or more vias added due to SM provide at least the total effective number of vias necessary for SM, and the one or more vias added due to EM provide at least the total effective number of vias necessary for EM. That is, in one embodiment, an analysis of the one or more added vias may be performed to determine each via's effective number, as was described above, to ensure that there are sufficient vias to address SM and sufficient vias to address EM. Also, note that any of the one or more vias added to address SM may be decoy vias, as were described above, in which the decoy via does not make an electrically functional connection between two metal layers. Therefore, at some point after EM and SM analysis, the integrated circuit is formed (e.g. manufactured) having both the additional vias added for SM as well as the additional vias added for EM. Note that also, as a result of SM analysis of a selected via, no additional vias may be needed. Also, as a result of EM analysis of the selected via, no additional vias may be needed. Therefore, for each selected via, zero or more additional vias may be determined as necessary for stress migration and zero or more additional vias may be determined as necessary for electromigration.

FIG. 9 illustrates a method 90 for selectively adding one or more vias to address stress migration and/or electromigration. Method 90 begins with block 92 in which stress migration (SM) analysis may be performed for each via of an integrated circuit model to result in the addition of one or more vias due to stress migration. That is, as a result of the SM analysis one or more vias may be added to the integrated circuit model to address the effects of stress migration. In one embodiment, method 70 of FIG. 7 may be used as the SM analysis. Alternatively, other methods for SM analysis may be used to determine the addition of one or more vias. After SM analysis, method 90 proceeds to block 94 in which the total effective vias of the one or more vias added to address SM in block 92 is determined. That is, as described above, for each of the one or more vias which were added to address SM, an effective via number can be determined. Then the effective via number of each of the one or more vias which were added to address SM can then be totaled to obtain the total effective vias (i.e. total effective via number) which were added to address SM. For example, if 3 vias are added for via 12, the total effective number of vias added may be some number, fractional or whole, less than 3. Method 90 then proceeds to block 96 in which electromigration (EM) analysis is performed on each via in order to add one or more vias due to EM while taking into consideration the previously determined total effective vias. For example, if an effective number of vias sufficient for addressing EM (which may be a fractional or whole number of vias) does not exceed the total effective number of vias which were added (in block 92) to address SM, then the one or more vias added to address SM is sufficient without needing to add any vias for EM. However, if the effective number of vias sufficient for addressing EM does exceed the total effective number of vias which were added to address SM, then only the effective number of vias for addressing EM are needed, and this effective number of vias for addressing EM is also sufficient for addressing SM. Also, note that any of the one or more vias added to address SM may be decoy vias, as were described above, in which the decoy via does not make an electrically functional connection between two metal layers. Therefore, at some point after EM and SM analysis, the integrated circuit is formed (e.g. manufactured) having those vias which are necessary to address both the SM and EM issues.

In an alternate embodiment, the sequence of steps may be reversed such that the computation of the number of vias needed for EM may be done prior to the computation of the number of vias needed for SM. In yet another alternate embodiment, the steps shown in FIGS. 8 and 9 may be further extended to take into account the process yield of the vias, and one or more additional vias may be added in a similar manner to account for vias that may not be functional due to yield-related reasons.

Figure 10:
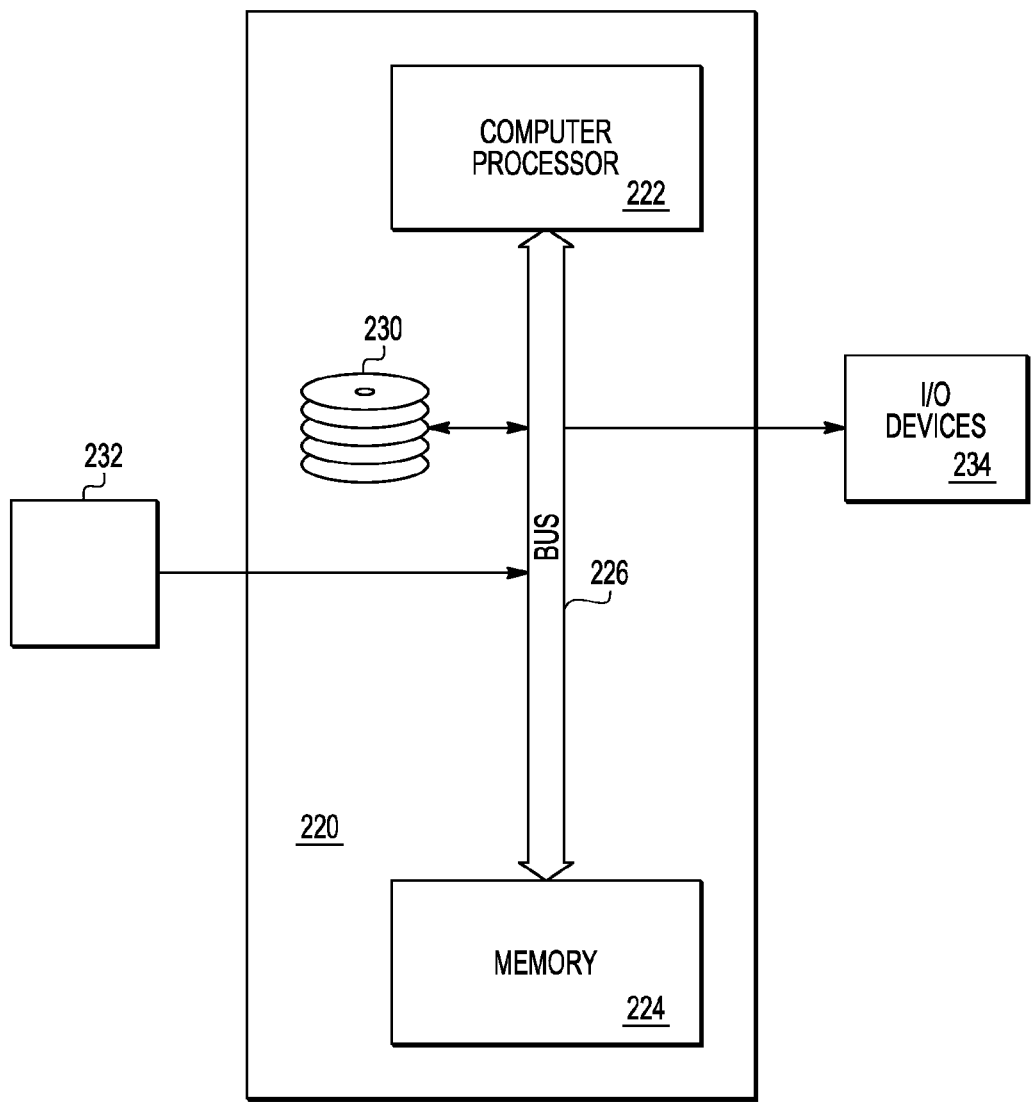
FIG. 10 illustrates, in block diagram form, a computer system in accordance with one embodiment of the present invention.

FIG. 10 illustrates, in block diagram form, a general purpose computer 220 in accordance with one embodiment of the present disclosure which may be used to execute the methods discussed herein. Computer 220 includes processor 222 and memory 224 coupled by a bus 226. Memory 224 may include relatively high speed machine readable media such as DRAM, SRAM, ROM, FLASH, EEPROM, MRAM, etc. Also coupled to bus 226 are secondary storage 230, external storage 232, and I/O devices 234. I/O devices 234 may include keyboard, mouse, printers, monitor, display, etc. Secondary storage 230 may include machine readable media such as hard disk drives, magnetic drum, etc. External storage 232 may include machine readable media such as floppy disks, removable hard drives, magnetic tape, CD-ROM, and even other computers, possibly connected via a communication line. It should be appreciated that there may be overlap between some elements, such as between secondary storage 230 and external storage 232. Executable versions of software which implements the methods herein, such as, for example, the methods of FIGS. 7, 8, and 9, can be written to, and later read from external storage 232, loaded for execution directly into memory 224, or stored on secondary storage 230 prior to loading into memory 224 and execution. Also, the integrated circuit models described herein may be stored I secondary storage 230 or external storage 232.

By now it should be appreciated that there has been provided a method for addressing stress migration and electromigration issues. In one embodiment, a measure of vacancies expected to reach a selected via is used to selectively add one or more vias to an integrated circuit model in order to address stress migration issues of the selected via. Furthermore, EM analysis may be performed in addition to SM analysis in order to determine a total number of vias to be added to an integrated circuit model to address both EM and SM issues. The integrated circuit model with the added vias may then be used to form an integrated circuit, which includes forming the added vias. In this manner, reliability and integrity of the vias and of the integrated circuit may be improved.

Although the invention is described herein with reference to specific embodiments, various modifications and changes can be made without departing from the scope of the present invention as set forth in the claims below. For example, different resistance and vacancy models may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of forming a connection between a first metal layer and a second metal layer overlying the first metal layer, and the method includes forming a first via between the first metal layer and the second metal layer; determining a first number of additional vias connected to the second metal layer, wherein the first number is necessary for stress migration; determining a second number of additional vias connected to the second metal layer, wherein the second number is necessary for electromigration; and forming a third number of additional vias, wherein the third number is equal to the first number plus the second number. Item 2 includes the method of item 1, wherein if the first number of additional vias is zero, then the third number equals the second number. Item 3 includes the method of item 1, wherein if the second number of additional vias is zero, then the third number equals the first number. Item 4 includes the method of item 1, wherein the determining the second number of additional vias comprises including at least one via expected to fail due to a processing failure. Item 5 includes the method of item 1, wherein the forming the third number of additional vias occurs simultaneously with forming the first via. Item 6 includes the method of item 1, wherein the steps of determining use a model of the first via. Item 7 includes the method of item 1, wherein the determining the first number of additional vias includes determining a measure of a number of vacancies expected to reach the first via and the first number of additional vias. Item 8 includes the method of item 1, wherein at least one of the first number of additional vias is a decoy via.

Item 9 includes a method of forming a connection between a first metal layer and a second metal layer overlying the first metal layer, and the method includes determining a first number of vias between the first metal layer and the second metal layer to achieve a first effective via number, wherein the first effective via number sufficiently takes into account stress migration effects; determining a second effective via number for connecting between the first metal layer and the second metal layer, wherein the second effective via number is sufficient for addressing electromigration; if the second effective via number does not exceed the first effective via number, forming, between the first metal layer and the second metal layer, the first number of vias; and if the second effective via number is greater than the first effective via number, forming, between the first metal layer and the second metal layer, a second number of vias in addition to forming the first number of vias to at least achieve the second effective via number. Item 10 includes the method of item 9, wherein the second number of vias is the least number that achieves the second effective via number. Item 11 includes the method of item 9, wherein the step of determining the first number of vias takes into account radii of the vias. Item 12 includes the method of item 9, wherein the step of determining the first number of vias takes into account expected vacancies from the first metal layer and expected vacancies from the second metal layer. Item 13 includes the method of item 9, wherein the step of determining the first number of vias includes determining an effective resistance for each via of the first number of vias based on expected vacancies from the first metal layer and the second metal layer. Item 14 includes the method of item 13, wherein the first effective via number is determined based on all of the effective resistances being in parallel.

Item 15 includes a method of forming a connection between a first metal layer and a second metal layer, wherein the second metal layer is over the first metal layer, and the method includes identifying a via location for a first via between the first metal layer and the second metal layer; determining additional locations for first additional vias, wherein the first additional vias are determined to be necessary for stress migration issues; determining additional locations necessary for second additional vias, wherein the second additional vias are determined to be necessary for electromigration issues; and forming the first via and one of the group consisting of (i) the first additional vias and the second additional vias and (ii) the first additional vias plus a number of vias sufficient for electromigration issues. Item 16 includes the method of item 15, wherein the determining the additional locations for the first additional vias includes determining the effective via number of the first additional vias. Item 17 includes the method of item 16, wherein the forming the first via and one of the group is further characterized by determining a measure of the expected vacancies from the first metal layer and the second metal layer in the first additional vias. Item 18 includes the method of item 17, wherein the determining the measure of expected vacancies includes taking into account metal volume as a function of distance. Item 19 includes the method of item 18, wherein the determining the measure of expected vacancies includes identifying a plurality of regions each having a volume and an effective distance wherein each region of the plurality of regions provides an expected contribution to the number of vacancies arriving at the first additional vias. Item 20 includes the method of item 15, wherein the forming the first via and one of the group comprises forming the first via, the first additional vias, and the second additional vias.

What is claimed is:

1. A method of forming a connection between a first metal layer and a second metal layer overlying the first metal layer, comprising:
    determining a first number of vias between the first metal layer and the second metal layer to achieve a first effective via number, wherein the first effective via number sufficiently takes into account stress migration effects;
    determining a second effective via number for connecting between the first metal layer and the second metal layer, wherein the second effective via number is sufficient for addressing electromigration;
    if the second effective via number does not exceed the first effective via number, forming, between the first metal layer and the second metal layer, the first number of vias;
    if the second effective via number is greater than the first effective via number, forming, between the first metal layer and the second metal layer, a second number of vias in addition to forming the first number of vias to at least achieve the second effective via number; and
    manufacturing an integrated circuit comprising the first number of vias, and, if the second number of vias are formed in addition to the first number of vias, the integrated circuit further comprises the second number of vias.

2. The method of claim 1, wherein the second number of vias is the least number that achieves the second effective via number.

3. The method of claim 1 wherein the step of determining the first number of vias takes into account radii of the vias.

4. The method of claim 1, wherein the step of determining the first number of vias takes into account expected vacancies from the first metal layer and expected vacancies from the second metal layer.

5. The method of claim 1, wherein the step of determining the first number of vias includes determining an effective resistance for each via of the first number of vias based on expected vacancies from the first metal layer and the second metal layer.

6. The method of claim 5, wherein the first effective via number is determined based on all of the effective resistances being in parallel.

\* \* \* \* \*